United States Patent
Kharrat et al.

(10) Patent No.: US 8,253,514 B2
(45) Date of Patent: Aug. 28, 2012

(54) ARRAY OF COUPLED RESONATORS, BANDPASS FILTER AND OSCILLATOR

(75) Inventors: Chady Kharrat, Sillans (FR); Eric Colinet, Meylan (FR)

(73) Assignee: Commissariat à l'Energie Atomique, Paris (FR)

(*) Notice: Subject to any disclaimer, the term of this patent is extended or adjusted under 35 U.S.C. 154(b) by 276 days.

(21) Appl. No.: 12/632,239

(22) Filed: Dec. 7, 2009

(65) Prior Publication Data

US 2010/0141355 A1    Jun. 10, 2010

(30) Foreign Application Priority Data

Dec. 9, 2008    (FR) .................................. 08 58383

(51) Int. Cl.
H03H 9/02    (2006.01)
H03H 9/205    (2006.01)

(52) U.S. Cl. ........................... 333/197; 333/199
(58) Field of Classification Search ................. 333/186, 333/219, 219.1, 222, 223, 235, 197, 199
See application file for complete search history.

(56) References Cited

U.S. PATENT DOCUMENTS

| | | | |
|---|---|---|---|
| 3,440,574 A | | 4/1969 | Johnson et al. |
| 6,236,281 B1 | | 5/2001 | Nguyen et al. |
| 7,251,466 B2 * | | 7/2007 | Porret et al. ............... 455/190.1 |
| 7,715,813 B2 * | | 5/2010 | Heng ......................... 455/150.1 |
| 2001/0030489 A1 | | 10/2001 | Nguyen |
| 2005/0140467 A1 | | 6/2005 | Duwel et al. |
| 2006/0125576 A1 | | 6/2006 | Ho et al. |

OTHER PUBLICATIONS

U.S. Appl. No. 12/936,773, filed Oct. 7, 2010, Kharrat, et al.
Seungbae Lee, et al., "Mechanically-Coupled Micromechanical Resonator Arrays for Improved Phase Noise," 2004 IEEE International Ultrasonics, Ferroelectrics, and Frequency Control Joint 50th Anniversary Conference. pp. 144-150.
Sheng-Shian Li, et al., "An MSI micromechanical differential disk-array filter," Dig. of Tech. Papers, the $14^{th}$ Int. Conf. on Solid-State Sensors & Actuators (Transducers '07), Lyon, France. Jun. 11-14, 2007, pp. 307-311.
Hengky Chandrahalim, et al., "Digitally-tunable MEMS filter using Mechanically-Coupled Resonator Array," MEMS 2008, Tucson, AZ, USA, Jan. 13-17, 2008, pp. 1020-1023.

* cited by examiner

*Primary Examiner* — Dean O Takaoka
(74) *Attorney, Agent, or Firm* — Oblon, Spivak, McClelland, Maier & Neustadt, L.L.P.

(57) ABSTRACT

An array of coupled resonators including: an input unit that supplies an input electrical signal; an electrical excitation unit that electrically excites N coupled resonators of the array using the input electrical signal, wherein the electrical excitation unit includes, for each of the N coupled resonators, an actuator, connected to the input unit, that actuates a respective one of the N coupled resonators according to the input electrical signal, and a variable gain input amplifier that amplifies actuation of a respective one of the N coupled resonators; and a controller that controls a specific setting of a variable gain of each of the variable gain input amplifier.

11 Claims, 5 Drawing Sheets

ARRAY OF COUPLED RESONATORS, BANDPASS FILTER AND OSCILLATOR

The present invention relates to an array of coupled resonators comprising means for supplying an input electrical signal and means for electrically exciting N coupled resonators of the array using this input electrical signal. It also relates to a bandpass filter that can, for example, be used as an RF (radio frequency) filter and an oscillator comprising such an array of coupled resonators.

It applies notably to the field of telecommunications, for the design of selective filters, or more generally to the field of electronic equipment, for the design of oscillators forming the time bases for pacing a computation unit or for handling signal demodulation.

BACKGROUND OF THE INVENTION

A resonator that can be excited by an electrical signal is indeed an electrical or electromechanical device defined primarily by its resonance frequency $f_0$ and its quality factor Q associated with the energy losses of the resonator. The resonance frequency and the quality factor depend on the geometrical parameters and on the nature of the materials used in the case of an electromechanical resonator, or on the values of its R, L or C type components in the case of an electrical resonator. Such a resonator can therefore be used in open loop mode to provide bandpass filtering about its resonance frequency, the bandwidth being all the narrower as the quality factor increases. It can also be used in closed loop mode, using an electronic feedback circuit to handle its oscillation by generating, from the signal supplied by the resonator, a signal capable of exciting the resonator on its resonance frequency $f_0$.

An array of coupled resonators is made up of several resonators that are coupled together mechanically (in the case of electromechanical resonators) or electrically (in the case of electrical resonators) so that the excitation of one of them provokes the mechanical vibration or electrical oscillation of all of the coupled resonators that have at least a degree of freedom in this array. These arrays of coupled resonators make it possible to envisage signal processing functions offering better power and better performance than when just one resonator is used. For example, when used to form filters, they make it possible to obtain an extended bandwidth.

Different types of resonators that can be excited by an electrical signal are known and can be used to form such an array. For example, surface acoustic wave (SAW), bulk acoustic wave (BAW) and quartz crystal resonators are electromechanical resonators whose main drawbacks are their relatively large size and their off-chip implementation leading to connections that introduce spurious values and noise and that make them bulky.

DESCRIPTION OF THE PRIOR ART

To resolve these problems of bulk and integration, it is preferable to use electromechanical resonators of NEMS (nano-electro-mechanical system) or MEMS (micro-electro-mechanical system) type, or electrical resonators of R, L, C type offering the possibility of fabricating the array of resonators collectively by microelectronics-based techniques. The NEMS/MEMS resonators in particular offer a reduced bulk and low consumption. They also make it possible to obtain high resonance frequencies and very high quality factors. Lastly, they are simple to produce and can be integrated with electronic data processing elements on one and the same chip or electronic circuit card.

Physically, the mechanical coupling between two NEMS/MEMS resonators is produced using a more or less rigid mechanical bridge, whereas the electrical coupling between two electrical R, L, C resonators can be produced using a capacitor or a mutual inductance.

The document by S. Lee and C. Nguyen entitled "Mechanically-Coupled Micromechanical Resonator Arrays for Improved Phase Noise", 2004 IEEE International Ultrasonics, Ferroelectrics and Frequency Control Joint 50th Anniversary Conference, describes an array of mechanically coupled resonators in MEMS technology.

This array consists of mechanically coupled plate-type electromechanical resonators whose output signal is linked to a gain stage. The output signal from this gain stage is in turn looped back to the actuation system common to all the resonators to form an oscillator. This particular array architecture makes it possible to obtain an oscillator that is overall less noise affected with a motional resistance that is as low as possible.

The document by S. Li, Y. Lin, Z. Ren and C. Nguyen entitled "An MSI Micromechanical Differential Disk-array Filter", Dig. Of Tech. Papers, 14th International Conference on Solid-State Sensors and actuators (Transducers '07), Lyon, France, 11-14 Jun. 2007, pages 307-311, describes another array of mechanically coupled resonators in MSI (medium-scale integration) technology.

This array, arranged in a matrix, consists of disk-type electromechanical resonators mechanically coupled by bridges whose lengths are expressed in fractions of the resonance wavelength. As previously, this architecture makes it possible to obtain a low motional resistance. It also makes it possible to eliminate some of the undesirable resonant modes from the array.

However, these architectures do not make it possible to adjust the center frequency or the bandwidth of the overall resonator, the resonator actuation frequency being fixed in advance by the placement of the actuators to emphasize at least one of the modes. However, this is done without completely eliminating the other modes that are simply strongly attenuated. Thus, in a time base application in the presence of strong dispersions on the resonance frequencies of each resonator, it is not possible with the abovementioned architectures to effectively correct these dispersions.

An architecture that makes it possible to adjust the bandwidth of a filter using an array of coupled resonators is described in the document by H. Chandrahalim and S. Bhave entitled "Digitally-tunable MEMS filter using Mechanically-Coupled Resonator Array", 21st IEEE International Conference on Micro Electro Mechanical Systems, Tucson, Ariz., USA, 13-17 Jan. 2008.

More specifically, this filter consists of an array of four series-coupled resonators, only the first of which is connected to an excitation electrode, and only the last of which is connected to a detection electrode. By also switching one or more of the coupled resonators of the array to a predetermined bias voltage, it is possible to select a particular operating mode of the filter from three possible modes, namely a wide band mode, a low band mode and a high band mode. This adjustment is, however, quite basic and inflexible.

It may thus be desirable to provide an array of coupled resonators that makes it possible to overcome the abovementioned problems and constraints.

SUMMARY OF THE INVENTION

A subject of the invention is therefore an array of coupled resonators comprising means for supplying an input electrical signal and means for electrically exciting N coupled resonators of the array using this input electrical signal. In this array of coupled resonators, the electrical excitation means comprise:

for each of these N coupled resonators:
actuation means connected to the means for supplying the input electrical signal for an actuation of this coupled resonator according to the input electrical signal, and
variable gain input amplification means for the actuation of this coupled resonator specific to this coupled resonator,
means for controlling a specific setting of the variable gain of each of the input amplification means.

Thus, by differently weighting the excitations of the different resonators of the array, it is possible to select a resonance center frequency and the bandwidth of the array of resonators. By also having means for dynamically setting this weighting using controlled variable gain amplification means, an array of resonators is obtained that has a resonance center frequency and bandwidth that can be set dynamically. Thanks to this simple setting, it is then possible to envisage powerful tunable bandwidth filtering or tunable resonance oscillation applications.

Optionally, each resonator comprises at least one vibrating element selected from one of the elements of the set consisting of a beam type element vibrating flection-wise, a disk, plate or beam type element vibrating volume-wise, and at least one nanowire.

Also optionally, the coupled resonators are electromechanical resonators of NEMS or MEMS type and the actuation and variable gain input amplification means of each of said N coupled resonators comprise an electrostatic excitation electrode, the bias voltage of which can be set by the control means.

Also optionally, since this array of resonators generates N different resonance modes at N different modal frequencies, since any vector signal resulting from N electrical signals supplied by said N coupled resonators in response to an excitation using the input electrical signal can be expressed as a linear combination of N predetermined modal vectors each expressing the response of said N coupled resonators in one of the N resonance modes, the control means are designed to selectively set the value of the N variable gains of the input amplification means according to the components of one of the N modal vectors, notably proportionally to these components.

Also optionally, an array of coupled resonators according to the invention can also comprise:

for each of these N coupled resonators, means for detecting a reaction of this coupled resonator, in response to the electrical excitation of the N coupled resonators by the input electrical signal, and for transforming this reaction into an intermediate electrical signal,
means for grouping together the intermediate electrical signals to form an output electrical signal, and the detection and transformation means of each of these N coupled resonators are associated with variable gain output amplification means for the intermediate signal that they supply specific to this coupled resonator, this variable gain being specifically able to be set by the control means.

Also optionally, the detection and transformation means and the variable gain output amplification means of each of said N coupled resonators comprise a capacitive detection electrode, the detection voltage of which can be set by the control means.

Also optionally, the control means are designed to set the value of the variable gains of the output amplification means according to the components of the selected modal vector to set the value of the variable gains of the input amplification means, notably proportionally to these components.

Also optionally, an array of coupled resonators according to the invention can also comprise a capacitive load connected to the grouping means to receive a current transmitted by these grouping means and configured so that the voltage at its terminals is representative of the output electrical signal.

Another subject of the invention is a bandpass filter with tunable center frequency comprising an array of coupled resonators as defined previously, designed to receive a signal to be filtered as input electrical signal for the array of resonators.

Another subject of the invention is an oscillator with tunable oscillation frequency comprising an array of coupled resonators as defined previously and a feedback circuit to supply the input electrical signal according to the output electrical signal of the array of resonators.

BRIEF DESCRIPTION OF THE DRAWINGS

The invention will be better understood from the following description, given solely by way of example, and in light of the appended drawings in which.

DESCRIPTION OF THE PREFERRED EMBODIMENTS

Figure 1:
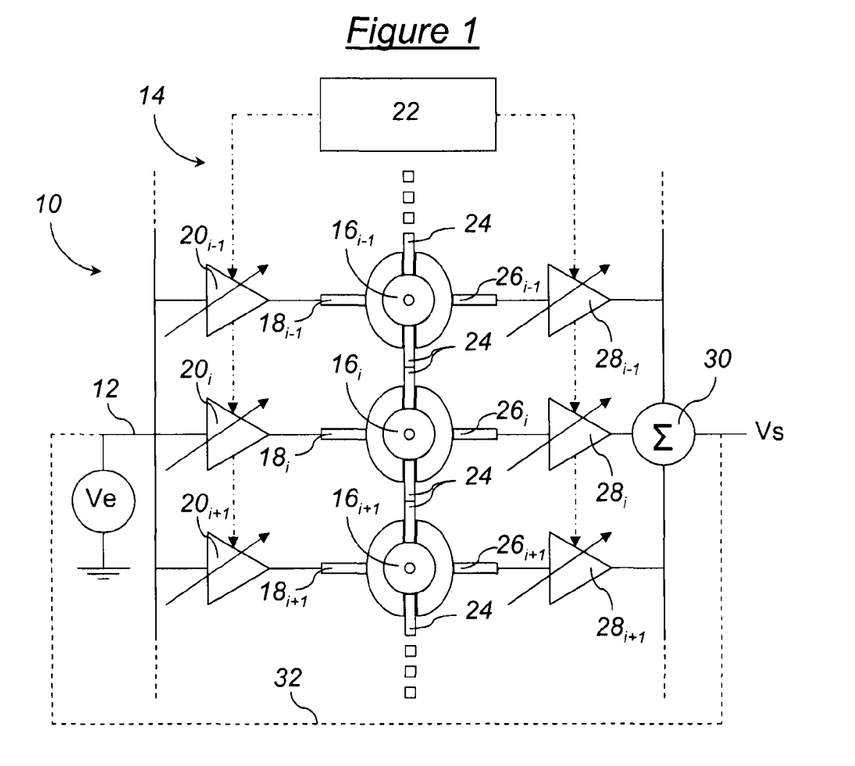
FIG. 1 diagrammatically represents the general structure of a one-dimensional array of coupled resonators according to a first embodiment of the invention.

The array 10 of coupled resonators represented in FIG. 1 comprises means 12 for supplying an input electrical signal Ve and means 14 for electrically exciting N coupled resonators $16_1, \ldots, 16_{i-1}, 16_i, 16_{i+1}, \ldots, 16_N$ using this input electrical signal Ve.

The electrical excitation means 14 comprise, for each of these N coupled resonators $16_1, \ldots, 16_{i-1}, 16_i, 16_{i+1}, \ldots, 16_N$, actuation means $18_1, \ldots, 18_{i-1}, 18_i, 18_{i+1}, \ldots, 18_N$ connected to the means 12 for supplying the input electrical signal for an actuation of this coupled resonator according to the input electrical signal, and respective variable gain input amplification means $20_1, \ldots, 20_{i-1}, 20_i, 20_{i+1}, \ldots, 20_N$. Each of these variable gain input amplification means $20_i$ is specific to the coupled resonator $16_i$ and is designed to amplify the actuation of this coupled resonator.

Furthermore, the electrical excitation means 14 comprise means 22 for controlling a specific setting of the variable gain GEi of each of the input amplification means $20_i$. These gain control means are conventional and will therefore not be detailed. They are of programmable type.

As illustrated in FIG. 1, each of the input amplification means $20_i$ is, for example, a variable gain input amplifier via which each of the corresponding actuation means $18_i$ is connected to the means 12 for supplying the input electrical signal. In another embodiment, for example that which will be detailed with reference to FIG. 5, the amplification means can be integrated in the actuation means.

Thus, by acting on the different gain values GEi, the actuation is weighted differently to excite the N coupled resonators $16_1, \ldots, 16_{i-1}, 16_i, 16_{i+1}, \ldots, 16_N$ of the array 10 differently. In this way, it is possible to dynamically influence the resonance center frequency and the bandwidth of the array of resonators.

Each electrically excited resonator $16_i$ is, for example, an electromechanical resonator comprising at least one vibrating element such as a beam type element vibrating flection-wise, a disk, plate or beam type element vibrating volume-wise or at least one nanowire.

In the particular example illustrated in FIG. 1, supplied purely by way of illustrative and nonlimiting example, the resonators are, according to scale, electromechanical resonators of NEMS or MEMS type with vibrating disk. The electrostatic actuation means of each resonator then comprise an excitation electrode connected to the means 12 for supplying the input electrical signal Ve via an amplifier.

Also in this particular example, the coupling of the resonators of the array 10 is mechanical and one-dimensional in as much as the resonators are coupled step by step, so as to form a row of N coupled resonators excited by N electrodes $18_1, \ldots, 18_{i-1}, 18_i, 18_{i+1}, \ldots, 18_N$. In other words, each resonator $16_i$ is mechanically coupled using mechanical structures 24, on the one hand to the resonator $16_{i-1}$, and on the other hand to the resonator $16_{i+1}$, which are its two adjacent resonators in the array 10. The mechanical coupling structures 24 are, for example, nano/micro beams, springs, etc. In the case of an array of electrical resonators of RLC type, the coupling would be electrical and provided by a component such as a capacitor or a mutual inductance.

At the ends of the array 10, different conditions can be envisaged, such as those supplying a clamped-clamped, clamp-free, free-free, cycling, and other type arrays. Among these, the resonator $16_1$ can be mechanically coupled to a resonator $16_0$ that is fixed and not excited by an electrode. Similarly, the resonator $16_N$ can be mechanically coupled to a resonator $16_{N+1}$ that is fixed and not excited by an electrode. The configuration is then a clamped-clamped array configuration.

Finally, the number N can vary from two resonators up to thousands of resonators, notably in the case of NEMS resonators.

The array 10 also comprises, respectively, for each of these N coupled resonators $16_1, \ldots, 16_{i-1}, 16_i, 16_{i+1}, \ldots, 16_N$, means $26_1, \ldots, 26_{i-1}, 26_i, 26_{i+1}, \ldots, 26_N$ for detecting a reaction from each coupled resonator in response to the electrical excitation of the N coupled resonators $16_1, \ldots, 16_{i-1}, 16_i, 16_{i+1}, \ldots, 16_N$ by the input electrical signal Ve, and for transforming this reaction into an intermediate electrical signal. In the particular example illustrated in FIG. 1, the detection and transformation means comprise capacitive detection electrodes. Each electrode $26_i$ is thus placed facing the corresponding resonator $16_i$ to detect the variation of the capacitance formed between it and this resonator following the mechanical vibrations of the latter. It supplies as output the abovementioned intermediate electrical signal.

The capacitive detection electrodes $26_1, \ldots, 26_{i-1}, 26_i, 26_{i+1}, \ldots, 26_N$ are also all linked at the output to means for grouping the N intermediate electrical signals to form an output electrical signal Vs. The grouping means comprise, for example, a simple summer 30 to which each electrode $26_i$ is linked via a variable gain output amplifier $28_i$ specific to the coupled resonator $16_i$.

Like the input amplifiers $20_1, \ldots, 20_{i-1}, 20_i, 20_{i+1}, \ldots, 20_N$, the output amplifiers $28_1, \ldots, 28_{i-1}, 28_i, 28_{i+1}, \ldots, 28_N$ can be linked to the control means 22 to allow for a specific setting of their respective gains GSi.

Similarly, in another embodiment, for example that which will be detailed with reference to FIG. 5, the output amplifiers can be replaced by amplification means integrated in the detection and transformation means. A first possible use of this array of resonators 10 relates to the bandpass filtering of a signal supplied as input electrical signal Ve for the array. At the output, Vs then represents the filtered signal.

A second possible application of this array of resonators 10 relates to the supply of a time base by using the array as an oscillator. For this, a feedback circuit 32 links the output of the summer 30 to the input of the array, at the means 12 for supplying the input electrical signal and in place of the signal Ve, so as to supply the input electrical signal according to the output electrical signal Vs from the array of resonators 10 and thus make the array resonant about a natural frequency.

Figure 2:
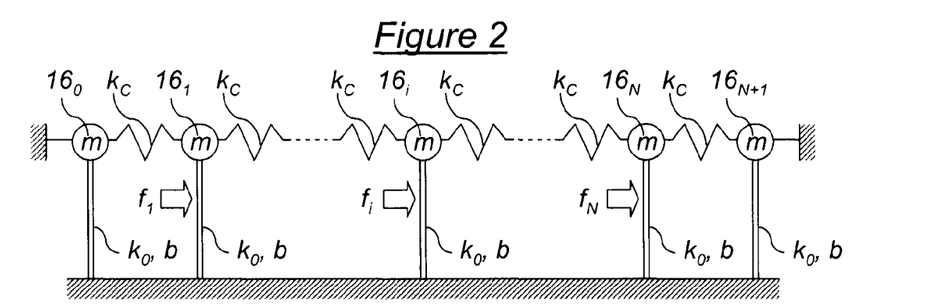
FIG. 2 represents an equivalent mechanical model of the array of coupled resonators of FIG. 1, FIGS. 3a, 3b, 3c graphically illustrate gain values that can be applied by control means of the array of coupled resonators of FIG. 1, FIGS. 4a and 4b graphically illustrate different possible frequency responses of the array of coupled resonators of FIG. 1, FIG. 5 diagrammatically represents the general structure of an oscillator according to one embodiment of the invention, FIG. 6 diagrammatically represents a circuit equivalent to a circuit for reading an output signal supplied by the oscillator of FIG. 5, FIG. 7 diagrammatically represents the general structure of a two-dimensional array of coupled resonators according to a second embodiment of the invention.

FIG. 2 represents an equivalent mechanical model of the array of coupled resonators of FIG. 1. Indeed, the dynamic behavior of the N resonators $16_1, \ldots, 16_{i-1}, 16_i, 16_{i+1}, \ldots, 16_N$, to which are added the two fixed end resonators $16_0$ and $16_{N+1}$, designed and dimensioned a priori to be identical and thus present one and the same resonance frequency, can be likened to that of mass (m), spring (of stiffness $k_0$), damping (of factor b) type resonators with one degree of freedom. In this model, the coupling between adjacent resonators is represented by a stiffness $k_C$.

According to the invention, using one and the same input signal Ve oscillating at a frequency $\omega$, it is possible to individually apply an excitation of specific amplitude to each of the N resonators $16_1, \ldots, 16_{i-1}, 16_i, 16_{i+1}, \ldots, 16_N$ by setting the gain values GEi.

In the mechanical model of FIG. 2, this is reflected in an actuating vector force F oscillating at the frequency $\omega$, of which each component $f_i$ is applied to the resonator $16_i$ independently of the others. The result of this is an oscillating mechanical displacement at the frequency $\omega$ and of amplitude $u_i$ for each of the N resonators $16_1, \ldots, 16_{i-1}, 16_i, 16_{i+1}, \ldots, 16_N$. These N displacements can be defined as a vector displacement U of the array whose components are the displacements of each of the N resonators with a degree of freedom. They are given by the following matrix expression:

$$\begin{bmatrix} -m\omega^2 + j\omega b + \\ k_0 + 2k_c & -k_c & 0 & \cdots & 0 \\ & -m\omega^2 + j\omega b + \\ -k_c & k_0 + 2k_c & -k_c & & \vdots \\ 0 & -k_c & \ddots & \ddots & \\ \vdots & & \ddots & & -k_c \\ & & & -m\omega^2 + j\omega b + \\ 0 & \cdots & & -k_c & k_0 + 2k_c \end{bmatrix} \begin{bmatrix} u_1 \\ u_2 \\ \vdots \\ \vdots \\ u_N \end{bmatrix} = \quad (1)$$

$$\begin{bmatrix} f_1 \\ f_2 \\ \vdots \\ \vdots \\ f_N \end{bmatrix}$$

It is shown, by a modal approach, that the vector response U of the N coupled resonators can be expressed as a linear combination of N modal vector responses $U^n$, called modal vectors, whose components $u_i^n$, respectively corresponding to the modal displacements of the resonators $16_i$ are defined as follows:

$$u_i^n = \sin\left(\frac{i \cdot n \cdot \pi}{N+1}\right). \quad (2)$$

It will be noted that the duly defined modal vectors $U^n$ form an orthogonal base for the following scalar product:

$$\langle U^n \mid U^{n'} \rangle = \sum_{i=1}^{N} u_i^n \cdot u_i^{n'}. \quad (3)$$

Indeed, a check is made to ensure that, according to this scalar product, $$\langle U^n \mid U^{n'} \rangle = 0 \Leftrightarrow n \neq n' \text{ and } \forall n, \langle U^n \mid U^n \rangle = \frac{N+1}{2}. \quad (4)$$

The displacement component $u_i$ of the resonator $16_i$ can therefore be written as a linear combination of the N modal components corresponding to the resonator $16_i$:

$$u_i = \sum_{n=1}^{N} a_n \cdot u_i^n. \quad (5)$$

It is also shown that each modal vector corresponds to a response mode of the array that has its own gain, its own bandwidth and its own resonance frequency (or angular velocity). By projecting the matrix equation defined previously onto the base formed by these modal vectors, it is easy to find the transfer functions $G_n(\omega)$ and the resonance angular velocities $\omega_n$ corresponding to each mode:

$$G_n(\omega) = \frac{a_n}{f_n}(\omega) = \frac{1/m}{-\omega^2 + j\omega b/m + \omega_n^2}, \text{ and} \quad (6)$$

$$\omega_n^2 = \frac{k_0 + 2k_c\left(1 - \cos\left(\frac{n\pi}{N+1}\right)\right)}{m}. \quad (7)$$

Thus, it is observed that, for a one-dimensional array of N coupled resonators $16_1, \ldots, 16_{i-1}, 16_i, 16_{i+1}, \ldots, 16_N$ with one degree of freedom, to which are added, at the two ends, two fixed resonators respectively coupled to the resonators $16_1$ and $16_N$, there are N separate resonance frequencies within the interval $$\left[\frac{k_0}{m}, \frac{k_0 + 4k_c}{m}\right]. \quad (8)$$

According to the model represented in FIG. 2, only one of the N response modes of the array 10 is activated by projecting the actuation of the array of resonators onto the corresponding modal vector. In other words, by applying a vector force F distributed so that it is collinear to one of the modal vectors $U^n$, a frequency response from the array is obtained that conforms to the corresponding mode n, of which the gain and resonance frequency (or angular velocity) are given by the equations (6) and (7).

By analogy, in one embodiment of the invention, one of the N frequency response modes of the array 10 is activated by projecting the input signal Ve onto one of the N modal vectors of the array 10, that is to say, by selectively setting the values of the N variable gains GEi of the amplifiers $20_1, \ldots, 20_{i-1}$, $20_i, 20_{i+1}, \ldots, 20_N$ according to the components of one of the N modal vectors, more specifically, proportionally to these components. This projection forces the array 10 to react as a bandpass filter on the selected mode. Consequently, only the mode corresponding to the modal vector onto which is projected the input signal Ve is activated, since the other modes do not respond, given that their modal coefficients are zero for any excitation frequency. The selective setting of the gains GEi is handled by the control means 22.

More generally, according to the invention, the center frequency and the bandwidth of the filtering produced by the array of resonators 10 is adjusted by selecting one or more modes to be activated thanks to the setting of the variable gains GEi.

Figure 3A:
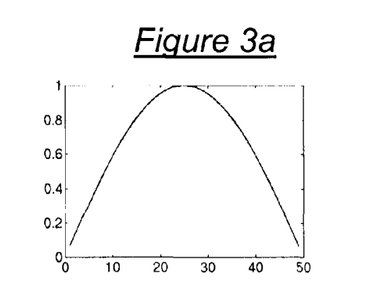
Figure 3B:
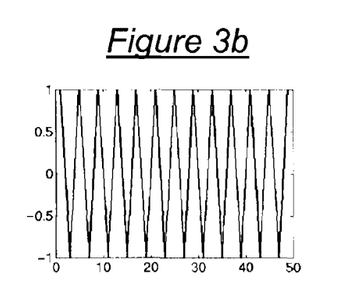
Figure 3C:
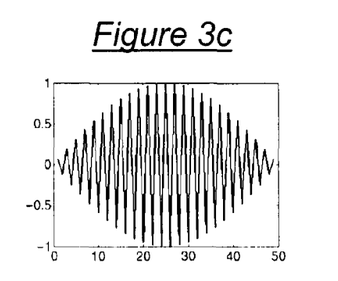

FIGS. 3a to 3c graphically illustrate examples of modal vectors for a fixed-end array of N=49 coupled resonators of NEMS type with resonance angular velocity equal to $10^7$ rad/s. FIG. 3a represents the forty-nine components of the modal vector of the first mode (n=1), FIG. 3b the forty-nine components of the modal vector of the center mode (n=25) and FIG. 3c the forty-nine components of the modal vector of the last mode (n=49).

The components of these modal vectors also represent the forty-nine gain values GEi to be set by the control means 22 to force the array 10 to react in the corresponding mode by projection of the actuation Ve onto the desired modal vector.

When a particular mode is selected by setting the input gains GEi according to the components of the corresponding modal vector, the output signal Vs from the array of resonators can be obtained at the output of a single resonator of the array. Advantageously, it is preferable to group together the outputs of all the resonators of the array 10 using the summer 30 to exploit all the responses, so as to raise the amplitude of the output signal Vs and reduce the impedance of the array of resonators.

However, if this grouping is done directly by connecting detection electrodes $26_1, \ldots, 26_{i-1}, 26_i, 26_{i+1}, \ldots, 26_N$ to the summer 30, the following is obtained:

$$Vs = \sum_{i=1}^{N} u_i = \sum_{i=1}^{N} a_n u_i^n = a_n \sum_{i=1}^{N} \sin\left(\frac{i \cdot n \cdot \pi}{N+1}\right) = \begin{cases} 0 & \text{for } n \text{ even} \\ \frac{2(N+1)}{n \cdot \pi} & \text{for } n \text{ odd.} \end{cases} \quad (9)$$

Such a grouping cannot be used because the output signal Vs is zero for the even modes and decreasing according to n for the odd modes.

According to one embodiment of the invention, the detection electrodes $26_1, \ldots, 26_{i-1}, 26_i, 26_{i+1}, \ldots, 26_N$ are linked to the summer 30 via output amplifiers $28_1, \ldots, 28_{i-1}, 28_i, 28_{i+1}, \ldots, 28_N$, of which the gains GSi are variable. The control means 22 are then designed to set the values of the variable gains GSi according to that of the gains GEi, that is to say according to the components of the modal vector selected at the input of the array of resonators. More specifically, the gain GSi of the output amplifier $28_i$ of the resonator $16_i$ is selected to be equal to the gain GEi of the input amplifier $20_i$ of this same resonator.

By using the orthogonality property (equation 4) of the scalar product defined previously, the following is then obtained at the output:

$$Vs = \sum_{i=1}^{N} u_i u_i^n = \sum_{i=1}^{N} a_n u_i^n u_i^n = a_n \sum_{i=1}^{N} u_i^n u_i^n = a_n \langle U^n | U^n \rangle = \frac{N+1}{2} a_n. \quad (10)$$

Thus, it can be seen that this particular setting of the gains of the output amplifiers makes it possible to amplify the overall gain at the output of the array of resonators by a factor (N+1)/2 compared to the gain of a single resonator. This setting improves the signal-to-noise ratio of the array of resonators compared to a single resonator and makes it more sensitive in detection.

Figure 4A:
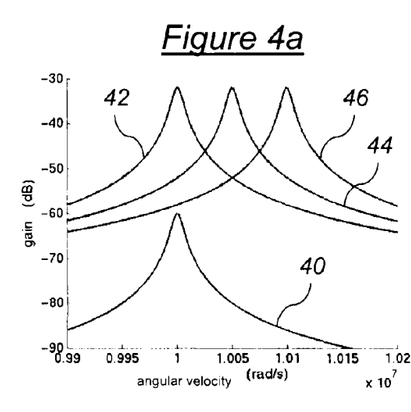

FIG. 4a graphically illustrates examples 42, 44 and 46 of possible modes of operation for an array 10 at the fixed ends of N=49 coupled resonators of NEMS type with resonance angular velocity equal to $10^7$ rad/s. As a comparison, the frequency response of just one of these resonators, in the case where it is not coupled to another, is represented by the curve 40, centered around the resonance angular velocity $10^7$ rad/s.

The curve 42 represents the frequency response of the array 10 according to its first mode of operation, when the gains GEi and GSi are set by the control means 22 at the values of the components of the modal vector represented in FIG. 3a. The value of the center frequency of this frequency response is given by a relation equivalent to that of the equation (7) for n=1.

The curve 44 represents the frequency response of the array 10 according to its central mode of operation, when the gains GEi and GSi are set by the control means 22 at the values of the components of the modal vector represented in FIG. 3b. The value of the center frequency of this frequency response is given by a relation equivalent to that of the equation (7) for n=25.

Finally, the curve 46 represents the frequency response of the array 10 according to its last mode of operation, when the gains GEi and GSi are set by the control means 22 at the values of the components of the modal vector represented in FIG. 3c. The value of the center frequency of this frequency response is given by a relation equivalent to that of the equation (7) for n=49.

It will be noted that the overall gain of the array of resonators 10 in each of its operating modes is far greater than that of a single resonator, as provided by the equation (10).

Figure 4B:
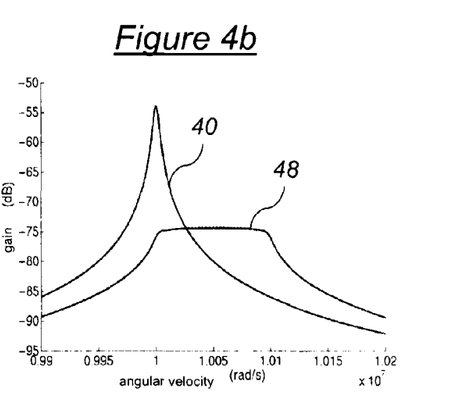

According to another possible operation of the array of resonators 10 illustrated in FIG. 4b, when only the first resonator $16_1$ is excited by the input signal Ve, all the operating modes of the array are activated via the coupling between all the resonators. These modes are activated using a sinusoidal modulation function $$f_n = \sin\left(\frac{n \cdot \pi}{N+1}\right),$$

which makes it possible to obtain a wide bandwidth filtering covering all of the range (8) of the center frequencies of the abovementioned N operating modes. Such a wide band filtering is illustrated by the curve 48.

It therefore emerges clearly that the array of resonators 10 makes it possible to produce a filter or an oscillator with center frequency and bandwidth that can be adjusted by providing setting means favoring simply and accurately one, several or all of its operating modes.

It is also possible to increase the number of operating modes of the array by increasing the number N of its resonators coupled with at least one degree of freedom. This thus makes it possible to increase the fineness of the possible adjustment of the center frequency of this array of resonators within the abovementioned range (8).

It is also possible to widen this range by increasing the force of the coupling between the resonators (factor $k_C$). The stronger the coupling, the greater the interval between the center frequency of the first mode and that of the last mode, and the greater the interval between the center frequencies of adjacent modes.

Finally, when such an array of N coupled resonators is physically produced, above all when the resonators are of small size such as NEMS or MEMS resonators, a dispersion of the characteristic parameters of these resonators (natural resonance frequency and quality factor) can have a negative effect on the performance of the array. It is shown in fact that by acting on the value of the coupling between resonators, but above all by increasing the number of coupled resonators, the effect of this dispersion on the array is substantially reduced. In fact, more specifically, the standard deviation of the natural resonance frequencies of the N resonators $16_1, \ldots, 16_{i-1}, 16_i, 16_{i+1}, \ldots, 16_N$ is inversely proportional to the square root of this number N. Thus, increasing N makes it possible not only to improve the fineness of the possible adjustment of the center frequency of the array of resonators, but also to compensate for a dispersion of the characteristic parameters of the resonators.

As indicated previously, the array of resonators 10 described hereinabove can be used as bandpass filter with tunable center frequency and bandwidth. In this application, the input signal of the filter is the signal Ve and Vs is the filtered signal.

The array of resonators 10 can also be used as an element of an oscillator with tunable center frequency. In this example, it must be associated with a feedback circuit able to return the output signal to the input of the array of resonators while providing a certain phase shift to fulfill the reaction conditions necessary to make the array oscillate. An exemplary embodiment of oscillator integrating an array of resonators according to one embodiment of the invention will now be detailed with reference to FIG. 5.

Figure 5:
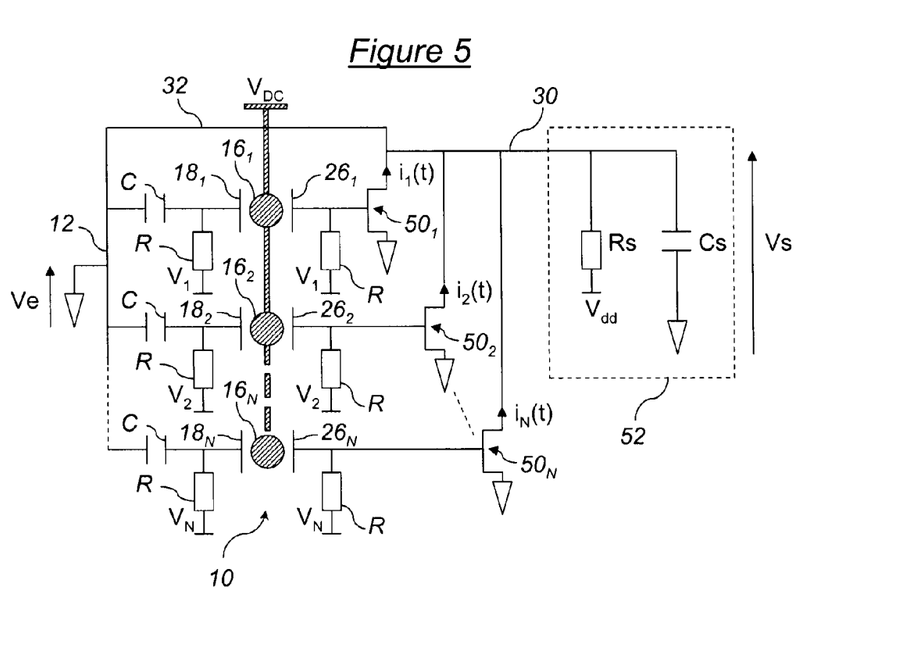

The oscillator represented in FIG. 5 comprises an array of resonators of NEMS or MEMS type, for example identical to the array described previously. It then has the same reference 10. According to this structure, the resonators are excited by electrostatic actuation, using electrodes, and their displacements are measured by a capacitive detection function, also using electrodes. Indeed, from the excitation point of view, each resonator $16_i$ is subject to an alternating potential difference between its metallic structure and corresponding excitation electrode $18_i$, which generates an oscillatory electrostatic force causing the resonator to vibrate. From the detection point of view, each vibration of the resonator $16_i$ generates a capacitance variation between its metallic structure and the corresponding detection electrode $26_i$.

The input 12 of the array of resonators is subject to a sinusoidal voltage Ve modulated for each resonator $16_i$ by the excitation electrode $18_i$ the transduction gain of which is variable and proportional to its bias voltage $V_i$. The value of this bias voltage $V_i$ can be set by the control means 22 and is specific to each resonator $16_i$. Indeed, from the electrostatic actuation point of view, if, in addition, each resonator $16_i$ is linked to a common potential $V_{DC}$, the potential difference between its metallic structure and its excitation electrode is equal to $(V_i-V_{DC})$+Ve. Considering the displacements of low amplitude, the electrostatic force being exerted on the resonator $16_i$ takes the following form:

$$f = \frac{\varepsilon_0 \cdot S \cdot [(V_i - V_{DC}) + Ve]^2}{d^2} \approx f_0 + \frac{\varepsilon_0 \cdot S \cdot (V_i - V_{DC}) \cdot Ve}{d^2}, \quad (11)$$

where $f_0$ is a continuous component, S is the surface of the excitation electrode $18_i$ and d is the distance between the excitation electrode $18_i$ and the resonator $16_i$.

It can clearly be seen according to this equation (11) that a variable gain amplification $(V_i-V_{DC})$ is produced on the voltage Ve by externally controlling the value of the voltage $V_i$. It is therefore possible to set each value of $V_i$ so that each value $(V_i-V_{DC})$ reproduces the value of the corresponding component of one of the modal vectors of the array of resonators $10_i$ so as to set the latter to one of its resonance modes.

Practically, resistors R are used to bias the excitation electrodes $18_1, \ldots, 18_i, \ldots, 18_N$ that are also linked to the means 12 for supplying the input signal via capacitors C.

From the detection point of view, the reaction of each resonator $16_i$ is detected and modulated by the detection electrode $26_i$, the transduction gain of which is variable and proportional to its bias voltage $V_i$. This bias voltage $V_i$ is set by the control means 22 to be equal to the bias voltage of the excitation electrode $18_i$, so as to amplify the output of the array of resonators as indicated previously. Furthermore, the intermediate signal supplied by the detection electrode $26_i$ passes through a gain stage $50_i$ comprising a transistor with transconductance g for the supply of a current of intensity $i_i(t)$ supporting the output signal.

The summer 30 is then produced by a simple grouping together of the gain stages $50_i$. It supplies a current $$i(t) = \sum_{k=1}^{N} i_i(t).$$

The oscillator represented in FIG. 5 also comprises a read circuit 52. This read circuit comprises a load resistor Rs linked to a predetermined potential Vdd and a load capacitor Cs linked to ground, at the terminals of which the output voltage Vs is measured.

Figure 6:
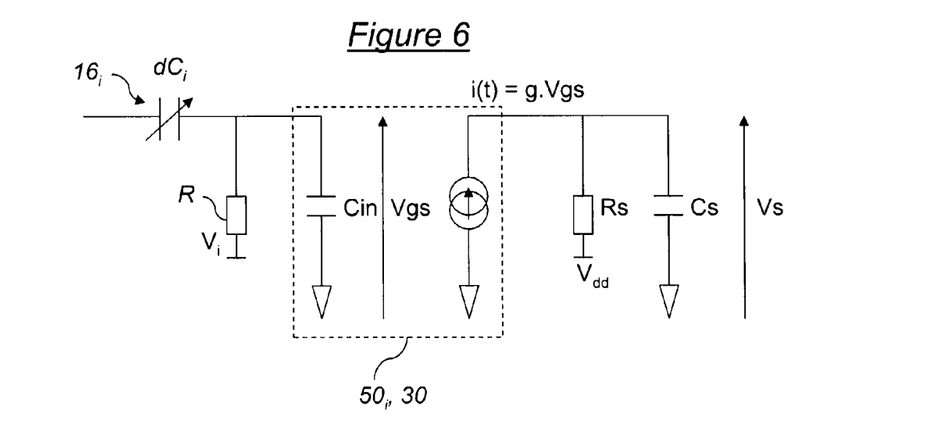

Thus, from the detection point of view, each resonator $16_i$ that can be considered as a capacitor with variable capacitance $dC_i$ oscillating at a frequency equal to that of the input signal Ve and differently biased, the circuit linking this resonator $16_i$ and its detection electrode $26_i$ to the load capacitor Cs and consisting of the gain stage $50_i$, of the summer 30 and of the read circuit 52 can be modeled by an equivalent circuit represented in FIG. 6.

According to the equivalent circuit, the transistor $50_i$ of the gain stage and the summer 30 are represented by a first input capacitive load circuit Cin linked to ground supplying a voltage Vgs and a second circuit generating current on the basis of the voltage Vgs and of the transconductance g of the transistor $50_i$. It is shown that, for each transistor $50_i$, the transfer function H linking the output voltage Vs to the variable capacitor $dC_i$ representing the displacements of the resonator $16_i$ takes the following form:

$$H = \frac{Vs}{dC_i} = -\frac{g(V_i - V_{DC})}{C_{in}Csj\omega}. \quad (12)$$

Consequently, the conventional Barkhausen conditions necessary to make the oscillator oscillate are satisfied since the transfer function H shows that the output voltage is proportional to the variable capacitance $dC_i$ of the resonator $16_i$ weighted by the gain $(V_i-V_{DC})$ and that, furthermore, it undergoes an integration $(1/j\omega)$.

By connecting all the resonators to the load circuit 52 and by linking this common load circuit to the input 12 using the feedback circuit 32, so that Ve=Vs, the assembly illustrated in FIG. 5 fulfills the function of an oscillator with resonance frequency that can be adjusted between several operating modes. In this configuration, the presence of the capacitors C between the excitation electrodes $18_1, \ldots, 18_i, \ldots, 18_N$ and the means 12 for supplying the input signal makes it possible to decouple the bias voltages of the excitation electrodes from the DC voltage at the output of the transistors $50_1, \ldots, 50_i, \ldots, 50_N$. By eliminating the feedback circuit 32, the assembly simply fulfills the function of a filter with tunable center frequency.

It will be noted that the abovementioned gain stage can be produced using CMOS, bipolar or even bi-CMOS technology. In the example of FIGS. 5 and 6, it is likened to a small field effect MOS transistor signal model. However, it could also be likened to a small bipolar transistor signal model by replacing the capacitors with resistors, the principle of the computations remaining identical.

In the embodiment described previously with reference to FIGS. 1 to 6, in which the coupling of the resonators is one-dimensional, the center frequency of the array of resonators is adjusted by selecting one mode in particular thanks to the choice of a weighting of the input and output gains compliant with the components of a modal vector from N predefined modal vectors. However, the bandwidth of the array of resonators in the selected operating mode is narrow given the curves 42 to 46. In this embodiment, to simply obtain a wider bandwidth, such as that of the curve 48, it is necessary, for example, to activate all the modes and in this case the center frequency is not tunable.

Figure 7:
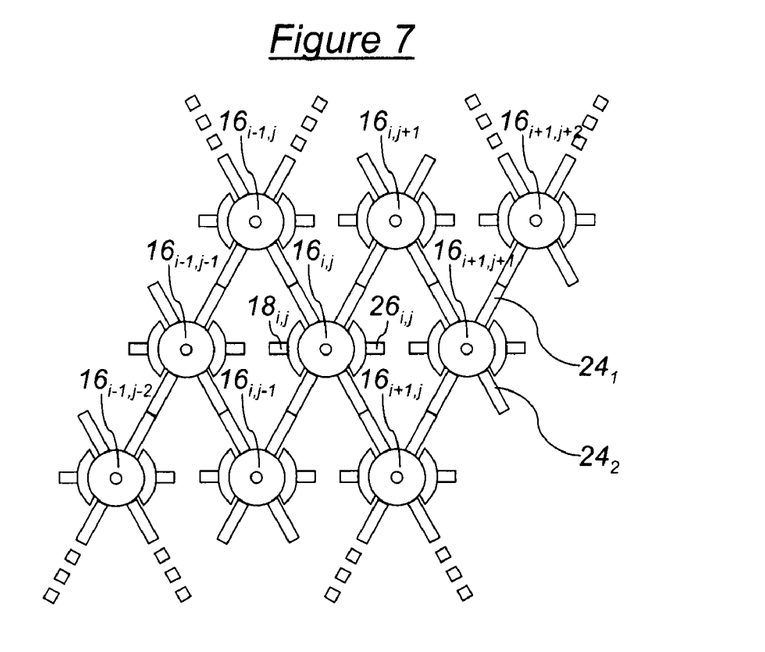

To obtain a wide bandwidth such as that illustrated by the curve 48 while having the possibility of setting the center frequency, one solution is given by the embodiment illustrated in FIG. 7.

In this second embodiment, the coupling of the resonators of the array 10 is two-dimensional in as much as the resonators are, on the one hand, coupled step by step by first coupling means $24_1$ so as to form rows i of N coupled resonators $16_{i,1}, \ldots, 16_{i,j}, \ldots, 16_{i,N}$ excited by N actuation means $18_{i,1}, \ldots, 18_{i,j}, \ldots, 18_{i,N}$, and, on the other hand, coupled step by step by second coupling means $24_2$ so as to form columns j of M coupled resonators $16_{1,j}, \ldots, 16_{i,j}, \ldots, 16_{M,j}$ excited by M actuation means $18_{1,j}, \ldots, 18_{i,j}, \ldots, 18_{M,j}$.

The coupling $24_1$ between resonators of one and the same row i is, for example, weak, so as to generate modes (that will be qualified as horizontal) of near center frequencies, and that ($24_2$) between resonators of one and the same column j is, for example, strong, so as to generate modes (that will be qualified as vertical) of distant center frequencies.

The resulting array of resonators 10 therefore comprises a matrix of M×N coupled resonators $16_{i,j}$ in M rows and N columns.

In the particular example illustrated in FIG. 7, supplied purely by way of illustration and nonlimiting, these resonators are, according to the scale, electromechanical resonators of NEMS or MEMS type with vibrating disk. The actuation means $18_{i,j}$ of each resonator $16_{i,j}$ therefore comprise an electrostatic excitation electrode, the transduction gain GEi,j of which can be set by setting its bias voltage using the control means 22 (not represented in this figure). As a variant, the electrostatic excitation electrode of the actuation means $18_{i,j}$ can have the same bias as the others and be connected to the means 12 for supplying the input electrical signal via a variable gain input amplifier GEi,j (not represented in this figure).

Furthermore, the detection means $26_{i,j}$ of each resonator $16_{i,j}$ comprise a capacitive detection electrode to detect the reaction of the resonator $16_{i,j}$ by measuring an electrical parameter that varies (i.e. the capacitance between the resonator and the electrode) because of its vibrations.

Each detection electrode $26_{i,j}$ is linked at the output to the summer 30 to form an output electrical signal Vs. Its transduction gain can, for example, be set by setting its bias voltage using the control means 22 (not represented in this figure). As a variant, the detection electrode $26_{i,j}$ can have the same bias as the others and be linked to the summer 30 via a variable gain output amplifier $28_{i,j}$ (not represented in this figure) specific to the coupled resonator $16_{i,j}$. In this configuration, like the input amplifiers $20_{i,j}$, the output amplifiers $28_{i,j}$ can be linked to the control means 22 to enable a specific setting of their respective gains GSi,j.

In this particular example as well, the two-dimensional coupling of the resonators of the array 10 is mechanical. In other words, each resonator $16_{i,j}$ is mechanically coupled using mechanical structures forming the coupling means $24_1$, on the one hand to the resonator $16_{i,j-1}$, on the other hand to the resonator $16_{i,j+1}$, which are its two adjacent resonators in the row i; each resonator $16_{i,j}$ is also mechanically coupled using mechanical structures forming the coupling means $24_2$, on the one hand to the resonator $16_{i-1,j}$, on the other hand to the resonator $16_{i+1,j}$, which are its two adjacent resonators in the column j. The mechanical coupling structures $24_1$ and $24_2$ are, for example, nano/micro beams, springs, etc. In the case of an array of electrical resonators of RLC type, the coupling would be electrical and produced by a component such as a capacitance or a mutual inductance.

Figure 8:
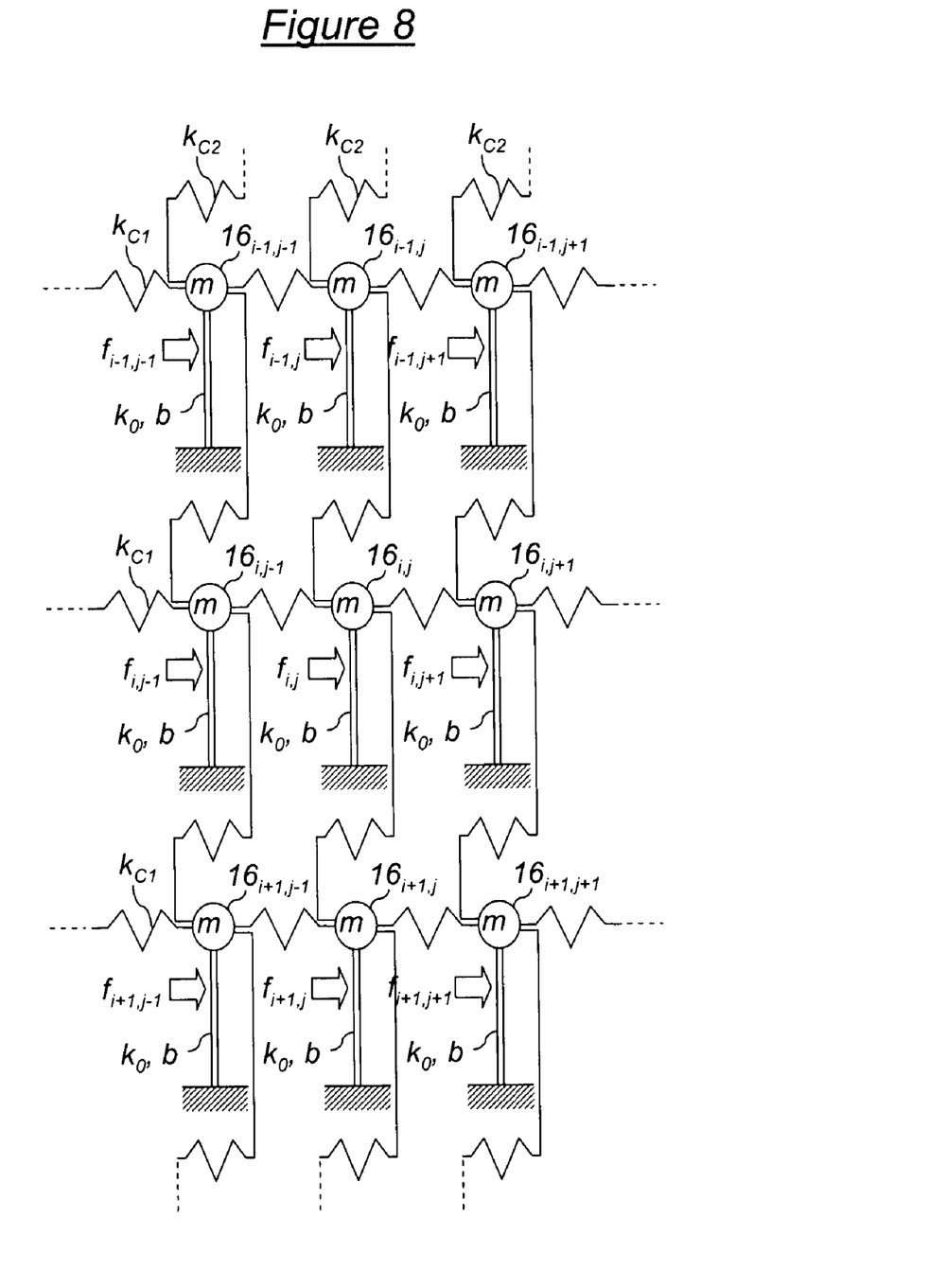
FIG. 8 represents an equivalent mechanical model of the array of coupled resonators of FIG. 7, and FIG. 9 graphically illustrates different possible frequency responses of the array of coupled resonators of FIG. 7.

FIG. 8 represents an equivalent mechanical model of the array of coupled resonators of FIG. 7. In this model, the resonators are of mass (µ), spring (of stiffness $k_0$), damping (of factor b) type with two degrees of freedom. The coupling between adjacent resonators of one and the same row is represented by a stiffness $k_{C1}$ and the coupling between adjacent resonators of one and the same column is represented by a stiffness $k_{C2}$.

According to the invention, using one and the same input signal Ve oscillating a frequency ω, it is possible to individually apply an excitation of specific amplitude to each of the M.N resonators $16_{1,1}, \ldots, 16_{i,j}, \ldots, 16_{M,N}$ by setting the gain values GEi,j.

In the mechanical model of FIG. 8, this is reflected in an actuating matrix force F oscillating at the frequency ω of which each component $f_{i,j}$ is applied to the resonator $16_{i,j}$ independently of the others. The result of this is a mechanical displacement oscillating at the frequency ω and of amplitude $u_{i,j}$ for each of the M.N resonators $16_{1,1}, \ldots, 16_{i,j}, \ldots, 16_{M,N}$. These M.N displacements can be defined as a matrix displacement U of the array whose components are the displacements of each of the M.N resonators.

It is shown, by a modal approach and as in the situation of a one-dimensional array, that the matrix response U of the M.N coupled resonators can be expressed as a linear combination of M.N modal matrix responses $U^{m,n}$, called modal vectors, the components $u_{i,j}^{m,n}$ of which, corresponding respectively to the modal displacements of the resonators $16_{i,j}$, are defined as follows, under certain fixing conditions at the ends:

$$u_{i,j}^{m,n} = \sin\left(\frac{i \cdot m \cdot \pi}{M+1}\right) \cdot \sin\left(\frac{j \cdot n \cdot \pi}{N+1}\right). \tag{13}$$

It will be noted that the modal vectors $U^{m,n}$ defined in this way form an orthogonal base for the following scalar product:

$$\langle U^{m,n} \mid U^{m',n'} \rangle = \sum_{i=1}^{M} \sum_{j=1}^{N} u_{i,j}^{m,n} \cdot u_{i,j}^{m',n'}. \tag{14}$$

Indeed, a check is carried out to ensure that, according to this scalar product, $$\langle U^{m,n} \mid U^{m',n'} \rangle = 0 \Leftrightarrow (m,n) \neq (m',n') \text{ and } \forall\, (m,n), \tag{15}$$

$$\langle U^{m,n} \mid U^{m,n} \rangle = \frac{M+1}{2} \cdot \frac{N+1}{2}.$$

The displacement component $u_{i,j}$ of the resonator $16_{i,j}$ can therefore be written as a linear combination of the M.N modal components corresponding to the resonator $16_{i,j}$:

$$u_{i,j} = \sum_{m=1}^{M} \sum_{n=1}^{N} a_{m,n} \cdot u_{i,j}^{m,n}. \tag{16}$$

It is also shown that each modal vector corresponds to a response mode of the array that has its own gain, its own bandwidth and its own resonance frequency (or angular velocity). By projecting the matrix equation defined previously onto the base consisting of these modal vectors, it is easy to find the transfer functions $G_{m,n}(\omega)$ and the resonance angular velocities $\omega_{m,n}$ corresponding to each mode:

$$G_{m,n}(\omega) = \frac{a_{m,n}}{f_{m,n}}(\omega) = \frac{1/\mu}{-\omega^2 + j\omega b/\mu + \omega_{m,n}^2}, \text{ and} \quad (17)$$

$$\omega_{m,n}^2 = \frac{k_0 + 2k_{C2}\left(1 - \cos\left(\frac{m\pi}{M+1}\right)\right) + 2k_{C1}\left(1 - \cos\left(\frac{n\pi}{N+1}\right)\right)}{\mu}. \quad (18)$$

Thus, it is observed that, for a two-dimensional array of M.N coupled resonators $16_{1,1}, \ldots, 16_{i,j}, \ldots, 16_{M,N}$ with two degrees of freedom, to which are added, at both ends, fixed resonators, there are M.N distinct resonance frequencies in the range $$\left[\frac{k_0}{\mu}, \frac{k_0 + 4k_{C1} + 4k_{C2}}{\mu}\right]. \quad (19)$$

According to the model represented in FIG. 8, it is possible to activate just one of the M.N response modes of the array 10 by projecting the actuation of the array of resonators onto the corresponding modal vector. In other words, by applying a vector force F distributed so that it is collinear to one of the modal vectors $U^{m,n}$, a frequency response is obtained for the array that conforms to the corresponding mode (m,n), the gain and the resonance frequency (or angular velocity) of which are given by the equations (17) and (18).

By analogy, in one embodiment of the invention, it is possible to activate one of the M.N frequency response modes of the array 10 by projecting the input signal Ve onto one of the M.N modal vectors of the array 10, that is to say by selectively setting the value of the M.N variable gains GEi,j of the amplifiers $20_{1,1}, \ldots, 20_{i,j}, \ldots, 20_{M,N}$ according to the components of one of the M.N modal vectors, more specifically proportionally to these components. This projection forces the array 10 to react as a bandpass filter to the selected mode. Consequently, only the mode corresponding to the modal vector onto which the input signal Ve is projected is activated, the other modes not responding, given that their modal coefficients are zero for any excitation frequency. The selective setting of the gains GEi,j is handled by the control means 22.

Figure 9:
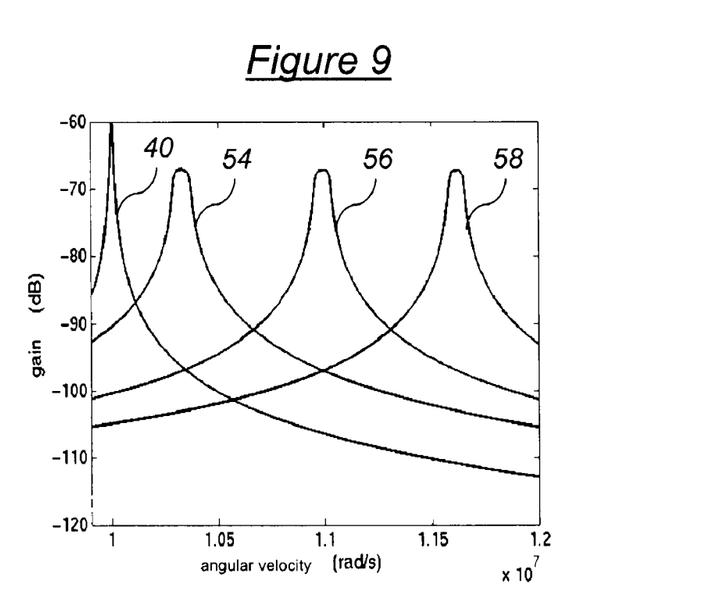

According to another possible operation of the array of resonators 10 illustrated in FIG. 9, when only the first resonator $16_{i,j}$ of each row i is excited by the input signal Ve, all the operating modes (i,n) of this row i are activated via the coupling $k_{C1}$ between all the resonators of the row. These modes are activated using a sinusoidal modulation function $$f_{m,n}(i) = \sin\left(\frac{i \cdot m \cdot \pi}{M+1}\right) \cdot \sin\left(\frac{n \cdot \pi}{N+1}\right),$$

which makes it possible to obtain wide bandwidth filtering covering all the period of the center frequencies of the N operating modes of the row i, in one of the M possible vertical operating modes.

FIG. 9 thus graphically illustrates examples 54, 56 and 58 of possible operating modes for an array 10 with fixed ends of M=3 by N=30 coupled resonators of NEMS type with resonance angular velocity equal to $10^7$ rad/s. As a comparison, the frequency response of just one of these resonators would be represented by the curve 40 if it were not coupled to others, this curve being centered around the resonance angular velocity $10^7$ rad/s.

The curve 54 represents the frequency response of the array 10 according to its first vertical operating mode (m=1), when the gains GEi,1 and GSi,1 are set by the control means 22 at the values of the function $f_{1,n}(i)$.

The curve 56 represents the frequency response of the array 10 according to its second vertical operating mode (m=2), when the gains GEi,2 and GSi,2 are set by the control means 22 at the values of the function $f_{2,n}(i)$.

Finally, the curve 58 represents the frequency response of the array 10 according to its last vertical operating mode (m=3), when the gains GEi,3 and GSi,3 are set by the control means 22 at the values of the function $f_{3,n}(i)$.

Thanks to this two-dimensional array, it can be seen that it is possible to obtain either an array of resonators with wide band filtering and tunable center frequency according to M different vertical modes or an array of narrow band resonators with center frequency that can be adjusted according to M.N different modes.

It clearly emerges that an array of resonators such as one of those described previously makes it possible to adjust with good accuracy the resonance center frequency by a simple gains setting.

Furthermore, by projecting the actuation but also the detection onto one and the same operating mode, it is possible to substantially increase the amplitude of the output signal from the array of resonators since the latter is then proportional to the number of resonators.

Thus, in a use of the array as oscillator, it is not necessary to provide a high gain in the reaction electrode to maintain the oscillations, since the output signal is already highly amplified in the case of a large number of resonators used in the array.

In selective filtering-type applications, it is possible to envisage resonant sensors based on arrays such as those described previously to design mass, acceleration, pressure or other sensors. The same principle used in the sensors with just one resonator can be applied, but by having a measurement signal greater by a factor proportional to the number of resonators, thus improving the signal-to-noise ratio and therefore facilitating the detection of very low variations.

Moreover, if the noises inherent to each resonator are not correlated, it is shown that the phase noise generated in the array of resonators is reduced by the fact that it is inversely proportional to the square root of the number of resonators.

Similarly, the array of resonators is robust to the dispersion of the resonance frequencies of the resonators since the standard deviation of this dispersion is also inversely proportional to the square root of the number of resonators.

Finally, in the case of resonators of very small size such as the resonators of NEMS type, the array of resonators can remain of very small size also, notably of a size less than the known resonators of MEMS type. It can also be produced by a co-integration technique making it possible to simultaneously produce resonators and electrical components.

It will also be noted that the invention is not limited to the embodiments described previously. Various modifications can be made by those skilled in the art to the embodiments described above, in light of the teaching that has just been disclosed. In the claims that follow, the terms used should not be interpreted as limiting the claims to the embodiments explained in the present description, but should be interpreted to include all the equivalents that the claims aim to cover by the way they are formulated and the provision of which is within the scope of those skilled in the art by applying their general knowledge to the implementation of the teaching that has just been disclosed to them.

Notably, the resonators are not necessarily produced using NEMS/MEMS technology. They can also be produced on the basis of quartz, electromechanical resonators other than NEMS/MEMS or by RLC circuits of passive electrical components.

The invention claimed is:

1. An array of coupled resonators comprising:
   means for supplying an input electrical signal;
   means for electrically exciting N coupled resonators of the array using the input electrical signal, wherein the means for electrically exciting includes, for each of the N coupled resonators,
      actuation means connected to the means for supplying the input electrical signal, for actuating a respective one of the N coupled resonators according to the input electrical signal, and
      variable gain input amplification means for amplifying actuation of a respective one of the N coupled resonators; and
   means for controlling a specific setting of a variable gain of each of the variable gain input amplification means.

2. The array of coupled resonators as claimed in claim 1, wherein each of the resonators comprises at least one vibrating element selected from one of a beam element vibrating flection-wise, a disk, plate or beam element vibrating volume-wise, and at least one nanowire.

3. The array of coupled resonators as claimed in claim 1, wherein the coupled resonators are NEMS or MEMS electromechanical resonators, and the actuation means and variable gain input amplification means of each of said N coupled resonators comprise an electrostatic excitation electrode, a bias voltage of which is set by the means for controlling.

4. The array of coupled resonators as claimed in claim 1, wherein the N coupled resonators generate N different resonance modes at N different modal frequencies, any vector signal resulting from N electrical signals supplied by said N coupled resonators in response to an excitation using the input electrical signal can be expressed as a linear combination of N predetermined modal vectors each expressing a response of said N coupled resonators in one of the N resonance modes, in which the means for controlling is designed to selectively set values of the N variable gains of the input amplification means according to components of one of the N modal vectors.

5. The array of coupled resonators as claimed in claim 1, further comprising:
   for each of the N coupled resonators, means for detecting a reaction of a respective one of the N coupled resonators, in response to electrical excitation of the N coupled resonators by the input electrical signal (Ve), and for transforming this reaction into an intermediate electrical signal, and
   means for grouping together the intermediate electrical signals to form an output electrical signal,
   wherein the means for detecting and transforming of each of the N coupled resonators are associated with variable gain output amplifier of the intermediate signal that they supply specific to the coupled resonator, this variable gain being specifically able to be set by the means for controlling.

6. The array of coupled resonators as claimed in claim 5, wherein the coupled resonators are NEMS or MEMS electromechanical resonators, and the actuation means and variable gain input amplification means of each of said N coupled resonators comprise an electrostatic excitation electrode, a bias voltage of which is set by the means for controlling, and
   the means for detecting and transforming and the variable gain output amplifier of each of said N coupled resonators comprise a capacitive detection electrode, a detection voltage of which can be set by the means for controlling.

7. The array of coupled resonators as claimed in claim 5, wherein the N coupled resonators generate N different resonance modes at N different modal frequencies, any vector signal resulting from N electrical signals supplied by said N coupled resonators in response to an excitation using the input electrical signal can be expressed as a linear combination of N predetermined modal vectors each expressing a response of said N coupled resonators in one of the N resonance modes, in which the means for controlling is designed to selectively set [values of the N variable gains of the input amplification means according to components of one of the N modal vectors, and
   the means for controlling sets values of variable gains of the variable gain output amplifiers according to components of a selected modal vector used to set the variable gain of the variable gain input amplification means.

8. The array of coupled resonators as claimed in claim 5, also comprising a capacitive load connected to the means for grouping to receive a current transmitted by these means for grouping and configured so that voltage at terminals of capacitive load is representative of the output electrical signal.

9. A bandpass filter with tunable center frequency comprising the array of the coupled resonators as claimed in claim 1, configured to receive a signal to be filtered as the input electrical signal of the array of the coupled resonators.

10. An oscillator with tunable oscillation frequency comprising:
    the array of the coupled resonators as claimed in claim 5; and
    a feedback circuit that supplies the input electrical signal according to the output electrical signal of the array of the coupled resonators.

11. An array of coupled resonators comprising:
    an input unit that supplies an input electrical signal;
    an electrical excitation unit that electrically excites N coupled resonators of the array using the input electrical signal, wherein the electrical excitation unit includes, for each of the N coupled resonators,
       an actuator, connected to the input unit, that actuates of a respective one of the N coupled resonators according to the input electrical signal, and
       a variable gain input amplifier that amplifies actuation of a respective one of the N coupled resonators; and
    a controller that controls a specific setting of a variable gain of each of the variable gain input amplifier.

* * * * *